US006236297B1

(12) United States Patent
Chou et al.

(10) Patent No.: US 6,236,297 B1
(45) Date of Patent: *May 22, 2001

(54) COMBINATIONAL INDUCTOR

(75) Inventors: Kuo-Yu Chou, Hsinchu Hsien; Shyang Su, Taipei Hsien; Jen-Tsai Kuo, Hsinchu, all of (TW)

(73) Assignee: Winbond Electronics Corp. (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/136,505

(22) Filed: Aug. 19, 1998

(30) Foreign Application Priority Data

Jul. 8, 1998 (TW) ................................. 87111033

(51) Int. Cl.⁷ ............................... H01F 27/28; H01F 5/00
(52) U.S. Cl. ......................... 336/200; 336/232; 336/180; 336/181
(58) Field of Search .................... 336/200, 232, 336/180, 181

(56) References Cited

U.S. PATENT DOCUMENTS

| 2,014,524 | * | 9/1935 | Franz | 336/200 |
| 2,874,360 | * | 2/1959 | Eisler | 336/200 |
| 3,002,260 | * | 10/1961 | Shortt et al. | 336/200 |
| 3,234,632 | * | 2/1966 | Marley | 336/200 |
| 4,651,254 | * | 3/1987 | Brede et al. | 336/200 |
| 5,477,204 | * | 12/1995 | Li | 336/232 |
| 5,521,573 | * | 5/1996 | Inoh et al. | 336/180 |

FOREIGN PATENT DOCUMENTS

| 1185354 | * | 2/1959 | (FR) | 336/200 |
| 58-141513 | * | 8/1983 | (JP) | 336/200 |
| 6-84647 | * | 3/1994 | (JP) | 336/200 |

* cited by examiner

Primary Examiner—Anh Mai
(74) Attorney, Agent, or Firm—Blakely Sokoloff Taylor & Zafman

(57) ABSTRACT

A combinational inductor, which can be constructed on a surface of a semiconductor substrate or an isolator, is provided. The combinational inductor includes several spiral inductors which are connected together in series. The spiral inductors can be constructed on the same layer to produce a combinational inductor structure, because of the same metalization process used. In another aspect, connecting methods between neighboring spiral conductors include forward cascade and reverse cascade. A spiral conductor has at least one neighboring spiral conductor which is connected with it in reverse cascade. The inductance per unit square measurement of the inductor in series can be significantly increased through the connections between neighboring spiral conductors either in forward cascade or reverse cascade.

9 Claims, 6 Drawing Sheets

COMBINATIONAL INDUCTOR

CROSS-REFERENCE TO RELATED APPLICATION

This application claims the priority benefit of Taiwan application Ser. No. 87111033, filed Jul. 8, 1998, the full disclosure of which is incorporated herein by reference.

BACKGROUND OF THE INVENTION

1. Field of Invention

The present invention generally relates to inductors, and more particularly to an inductor implemented using, semiconductor fabricating methods.

2. Description of Related Art

The development of telecommunication technologies is growing rapidly nowadays, thanks to considerable advancement of semiconductor technologies. Generally speaking, the manufacturing of a high-frequency inductor in a semiconductor fabrication process is very difficult. An ideal semiconductor inductor needs to possess good characteristics such as high inductance density, high quality factor, and high stability, which therefore make the inductors difficult to produce. During the manufacturing of inductors, inductance value can be increased by increasing number of turns of an inductor. Unfortunately, the parasitic capacitance on a substrate is also increased therewith, such that the self-resonant frequency is reduced. Normally, a multi-level inductor structure can be used to solve this problem, which is described hereinafter.

FIG. 1 shows a conventional multi-level inductor, which is disclosed in U.S. Pat. No. 5,610,433. As shown in this figure, inductor 10 uses coils M1, M2, and M3 to build a three-layers inductor structure, in which every coil can be made from several circular metal conductors of different diameters. The coil structure shown in FIG. 1, which has an inner conductor and an outer circular conductor, is one of the examples. The diameter of the coil is typically ranged from tens of micro meters to thousands of micro meters. Metal material used can be aluminium or other materials with a high conductivity. Interconnections between coils in every layer are also shown in this figure. This kind of interconnection can be implemented by using a via between isolating layers. As shown in the figure, where directions of current are designated by arrows, a current is fed into the inductor 10 via a conducting wire 11, and flowed out from a conducting wire 48.

Through the multi-level inductor structure can achieve the objective of increasing the inductance per unit square measurement, it complicates the manufacturing process, which subsequently reduces the reliability. Furthermore, typical microwave circuits are not based on the multi-level structure. It will be uneconomical and time-consuming, if the inductor is produced using additional metalization processes and masks.

Another conventional way to increase the inductance value is the use of additional number of turns for a coil. Unfortunately, these additional turns not only take extra space, but also reduce the inductance per unit square measurement. Usable space is therefore wasted and the self-resonant frequency is reduced. The preset objective can not be achieved by using the additional turns in a coil.

As a summary, the conventional inductor structure has the following disadvantages:

1. The multi-level inductor structure complicates the manufacturing process, such that the reliability is reduced.

2. The multi-level inductor structure requires additional metalization processes and masks, which is uneconomical and time-consuming.

3. Increasing number of turns for a coil not only reduces the self-resonant frequency, but also significantly reduces the inductance per unit square measurement, resulting in wastes of usable space.

SUMMARY OF THE INVENTION

It is therefore an objective of the present invention to provide a combinational inductor, which can be implemented by using a single-layer structure, to reduce the complexities in the manufacturing process so that the reliability can be increased.

It is another objective of the present invention to provide a combinational inductor, which can significantly increase the inductance value while maintaining the original inductance per unit square measurement.

In accordance with the foregoing and other objectives of the present invention, a combinational inductor, which can be constructed on a surface of a semiconductor substrate or an isolator, is provided. The combinational inductor includes several spiral inductors which are connected together in series. Further, the spiral inductors can be constructed on the same layer to produce a combinational inductor structure, because of the same metalization process used. In another aspect, connecting methods between spiral conductors include forward cascade and reverse cascade. A spiral conductor has at least one neighboring spiral conductor which is connected with it in reverse cascade. Based on the connecting methods provided, the combinational inductor can therefore significantly increase the inductance value while maintaining the original inductance per unit square measurement.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
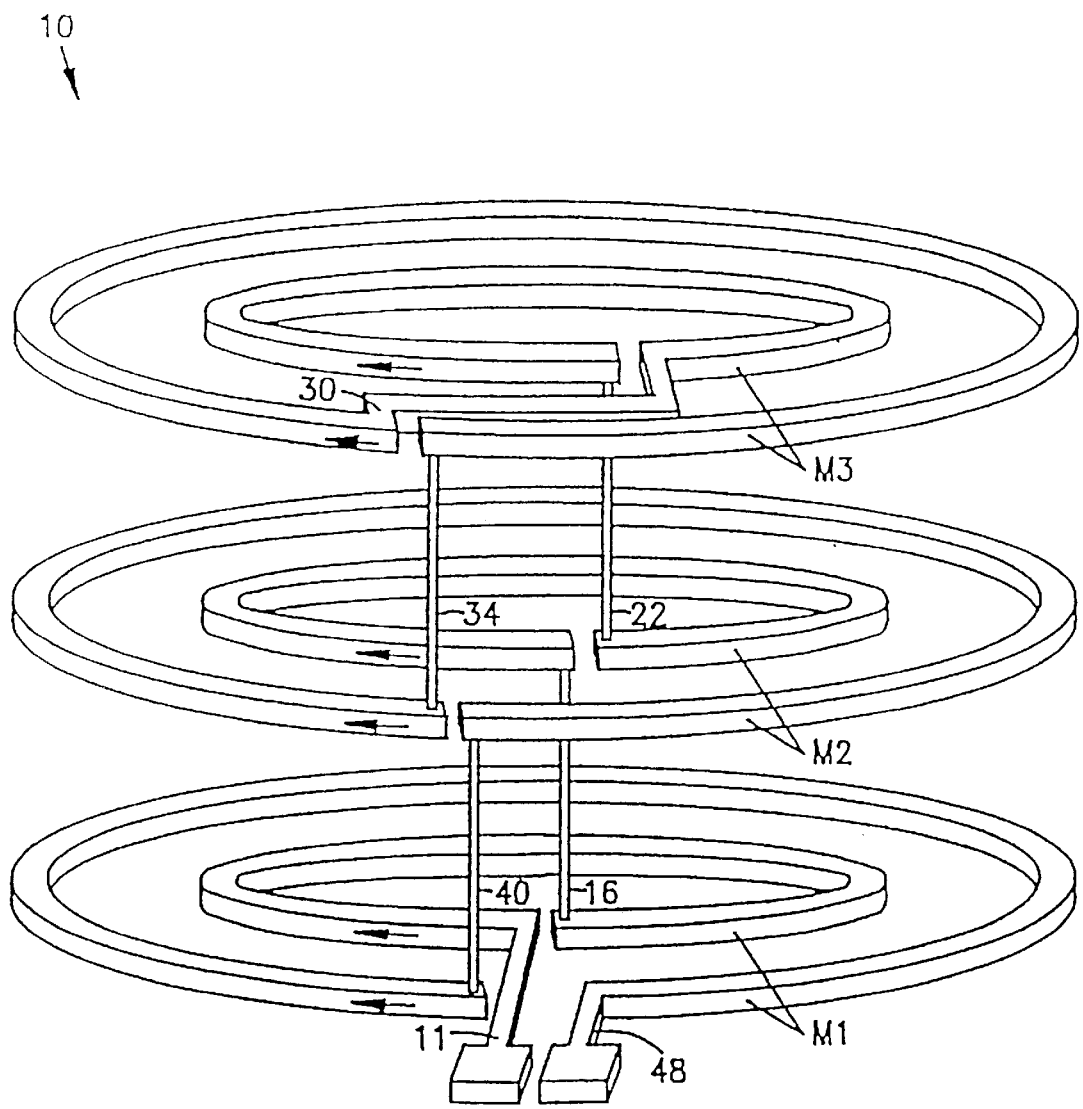
FIG. 1 is a conventional multi-level inductor.

Reference will now be made in detail to the present preferred embodiments of the invention, examples of which are illustrated in the accompanying drawings. Wherever possible, the same reference numbers are used in the drawings and the description to refer to the same or like parts.

Figure 2:
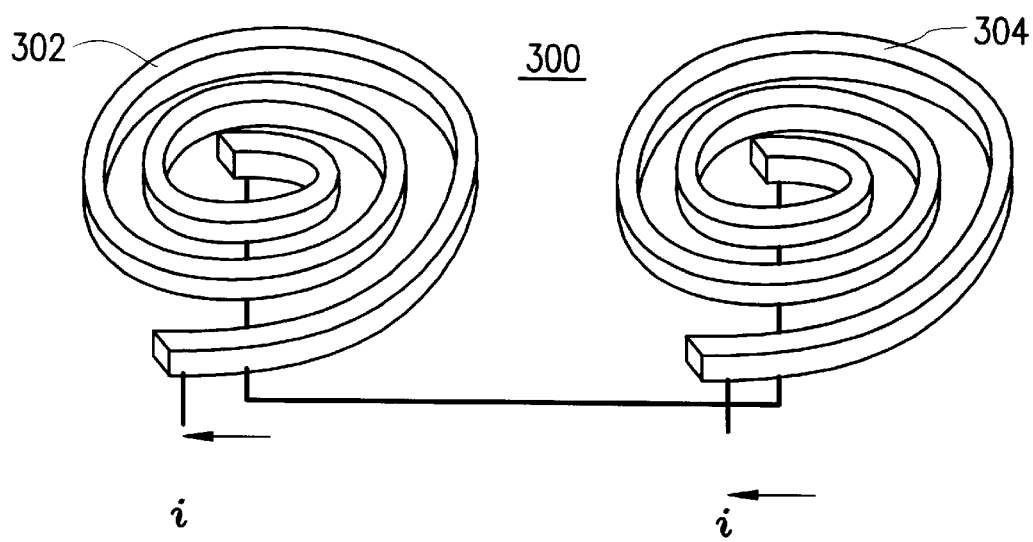
FIG. 2 is a combinational inductor according to a first preferred embodiment of the present invention.

Refer to FIG. 2, which shows a combinational inductor according to the first preferred embodiment of the present invention. As shown in this figure, inductor 300 is consisted of a spiral conductor 302 and a spiral conductor 304 connected in series. This kind of connection is called a reverse cascade, because the direction of current in the spiral conductor 302 is counter-clockwise, while the direction of current in the spiral conductor 304 is clockwise. If the direction of current in the spiral conductor 304 is the same as the spiral conductor 302, the connection is called a forward cascade. According to experimenting results, equivalent inductance obtained using the reverse-cascade connection is higher than that using the forward-cascade connection. Thus, only the reverse-cascade connection is described hereinafter. Note also that the inductance value for the spiral conductor 302 and the spiral conductor 304 can be the same (with the same geometric structure and environmental conditions), or different (with different geometric structure and environmental conditions). The inductance value of two spiral conductors having the same conditions connected in series is two times as large as that of a single spiral conductor. However, the area taken by the connected spiral conductors is also twice as large as that taken by a single spiral conductor. Due to these reasons, the inductance per unit square measurement for these two implementations is almost the same.

Figure 3:
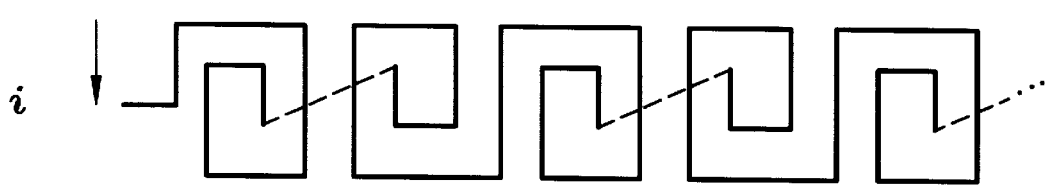
FIG. 3 is a combinational inductor according to a second preferred embodiment of the present invention.

Refer to FIG. 3, which shows a combinational inductor according to the second preferred embodiment of the present invention, where several spiral conductors are connected in reverse cascade along the same direction to form an inductor with an increased inductance.

Figure 4:
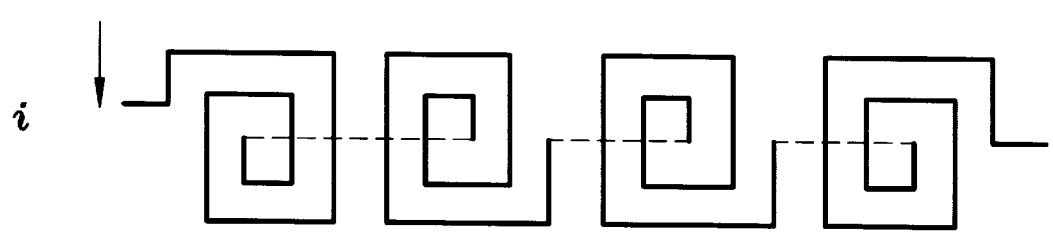
FIG. 4 is a combinational inductor according to a third preferred embodiment of the present invention.

Refer to FIG. 4, which shows a combinational inductor according to the third preferred embodiment of the present invention, where several spiral conductors are connected in series along the same direction to form an inductor. Compared with the second preferred embodiment where the spiral conductors are connected in reverse cascade, the connections between the spiral conductors in this embodiment are in an order of forward, reverse, forward, reverse, forward, . . . , etc, with which the inductance value of the inductor can also be increased.

Figure 5:
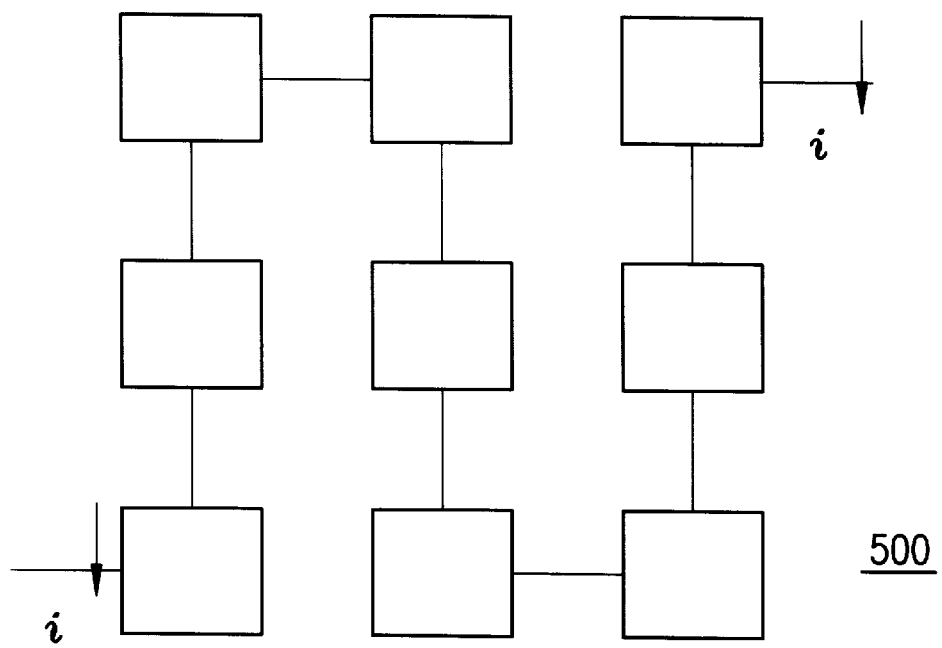
FIG. 5 is a combinational inductor according to a fourth preferred embodiment of the present invention.

Refer to FIG. 5, which shows a combinational inductor according to the fourth preferred embodiment of the present invention, where several spiral conductors are connected in reverse cascade to form an inductor matrix 500 so as to increase the inductance value and enhance the practicality.

Figure 6:
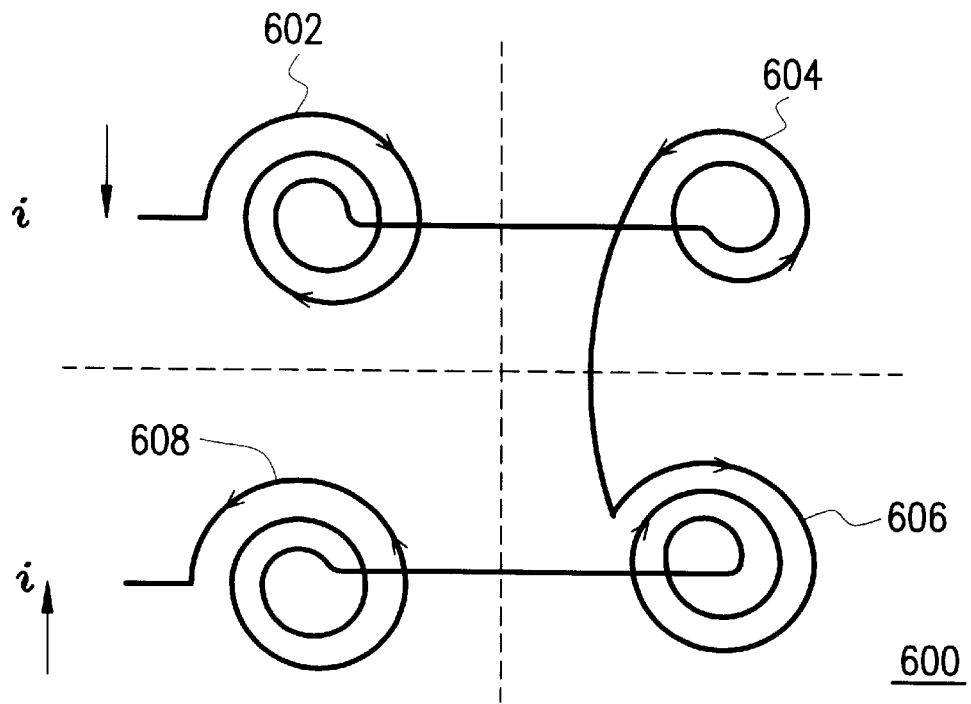
FIG. 6 is a combinational inductor according to a fifth preferred embodiment of the present invention.

Refer to FIG. 6, which shows a combinational inductor according to the fifth preferred embodiment of the present invention, in which an inductor matrix 600 is formed by using spiral conductors 602, 604, 606, and 608 which are connected in reverse cascade, so as to increase the inductance value and enhance the practicality.

In order to characterize the features and practicality of the present invention, several experimenting results are presented hereinafter. It is expected that these results will provide a better understanding to the invention.

Figure 7:
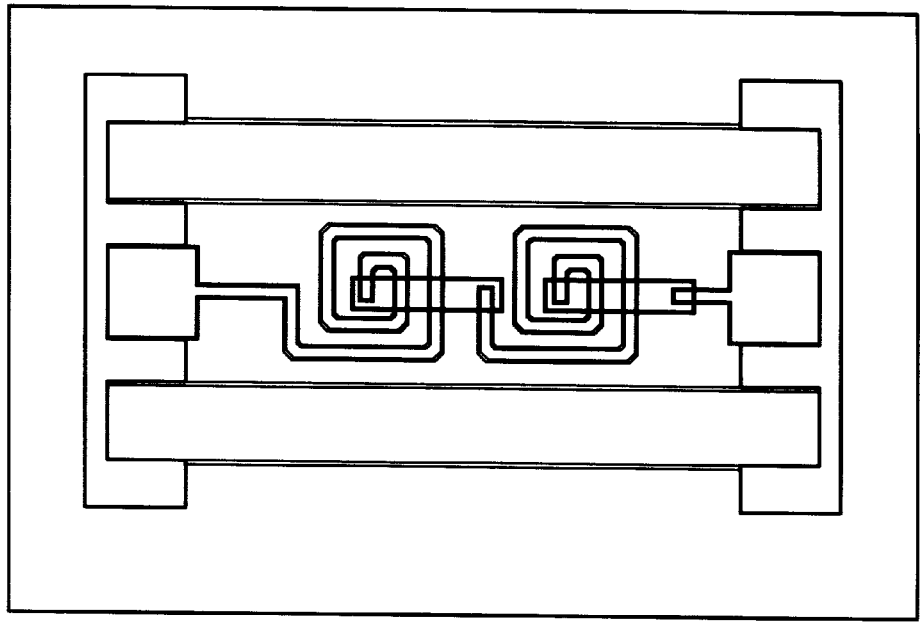
FIG. 7 is a combinational inductor implemented using two spiral inductors connected in forward cascade.
Figure 8:
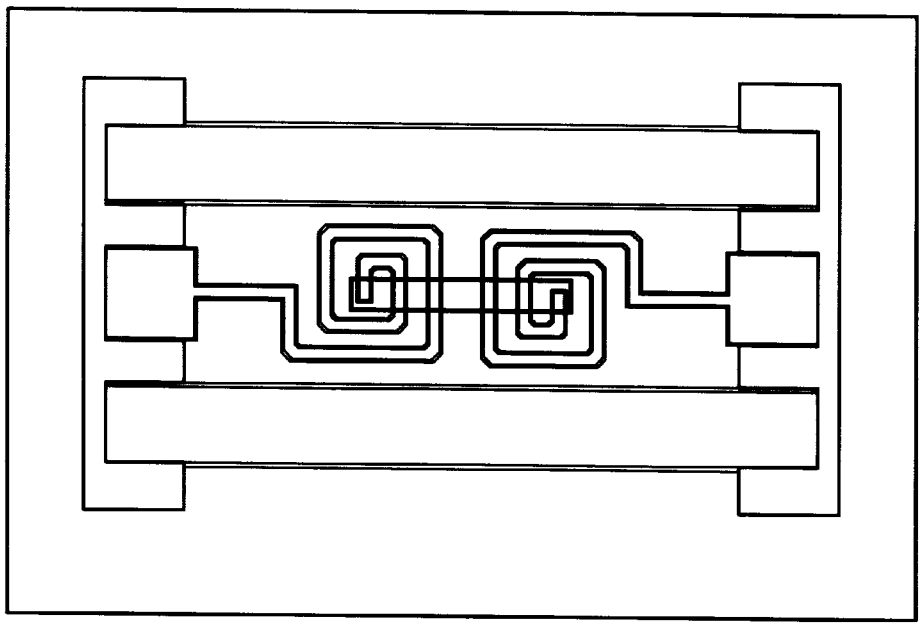
FIG. 8 is a combinational inductor implemented according to the first preferred embodiment of the present invention.

Refer to FIG. 7, which shows two spiral conductors connected together in forward cascade to form a combinational inductor. On the other hand, FIG. 8 shows a combinational inductor which is implemented using two spiral conductors connected together in reverse cascade. The characteristics of these two implementations will be described hereinafter, so that operating characteristics of these combinationl inductors can be better understood and applied in the industry.

Figure 9:
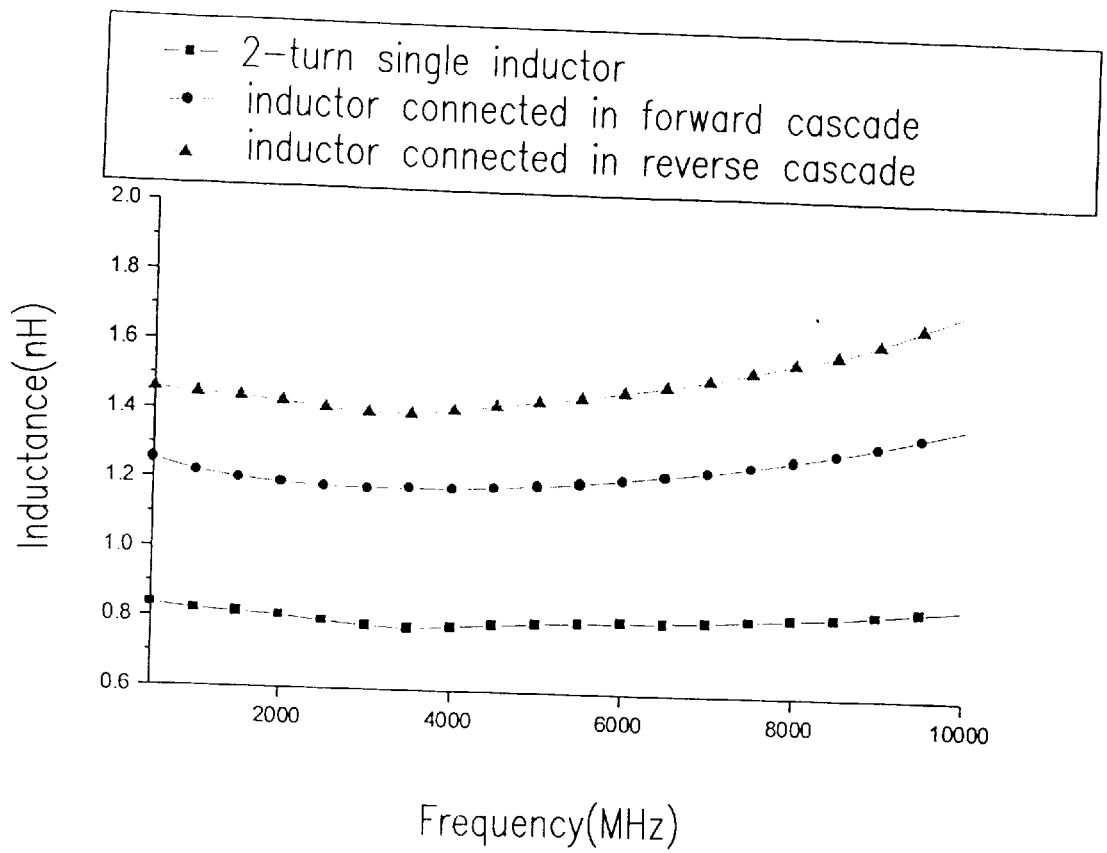
FIG. 9 shows effect of different connecting methods of inductors on the inductance value.

Refer to FIG. 9, which shows effect of different connecting methods of inductors on the inductance value. As shown in this figure, where a 2-turn single inductor is used as the comparison basis, the inductor connected in reverse cascade has the largest inductance value, the inductor connected in forward cascade is the next, and the 2-trun single inductor has the smallest inductance value.

Figure 10:
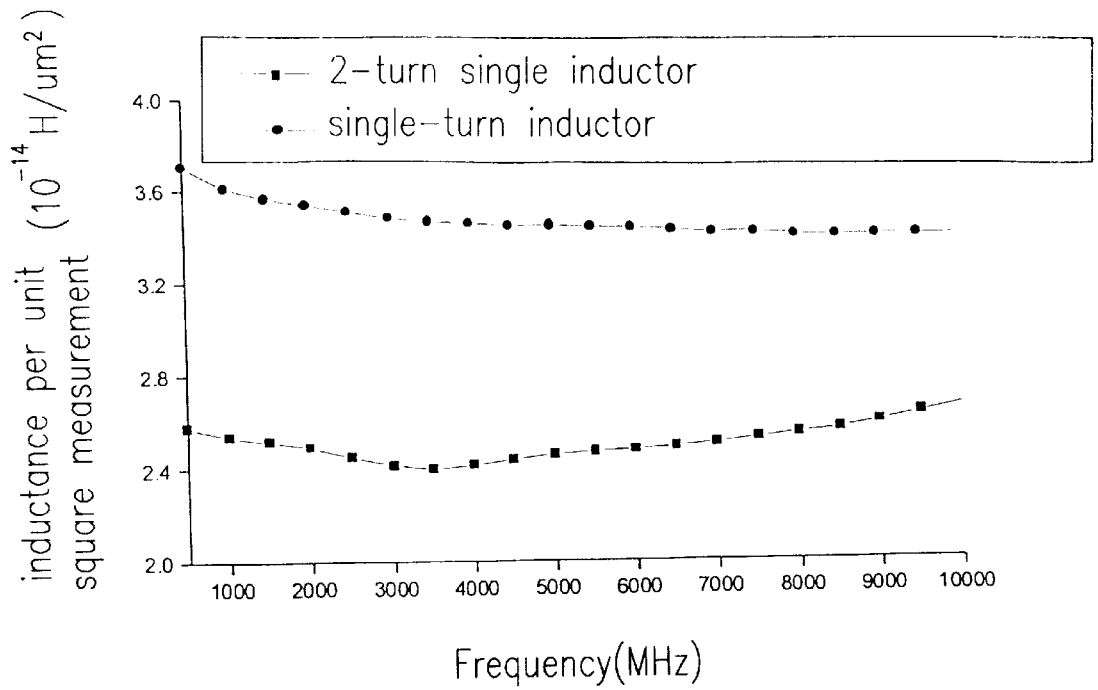
FIG. 10 shows the relationship between number of turns and the inductance per unit square measurement for an inductor.

Refer to FIG. 10, which shows the relationship between number of turns of a coil and the inductance per unit square measurement for an inductor. It is well know that increasing the number of turns of an inductor will increase the inductance value. Unfortunately, when the number of turns of an inductor are so increased, the inductance per unit square measurement is subsequently reduced. As shown in this figure, the 2-turn inductor has a inductance per unit square measurement which is about 70% to 76% of that of a single-turn inductor. That is, the inductance per unit square measurement reduces when the number of turns of an inductor increases. It is therefore not an economical way to increase the inductance value by increasing the number of turns of an inductor under a limited-space environment. Also, the overall performance of the inductor is deteriorated.

Figure 11:
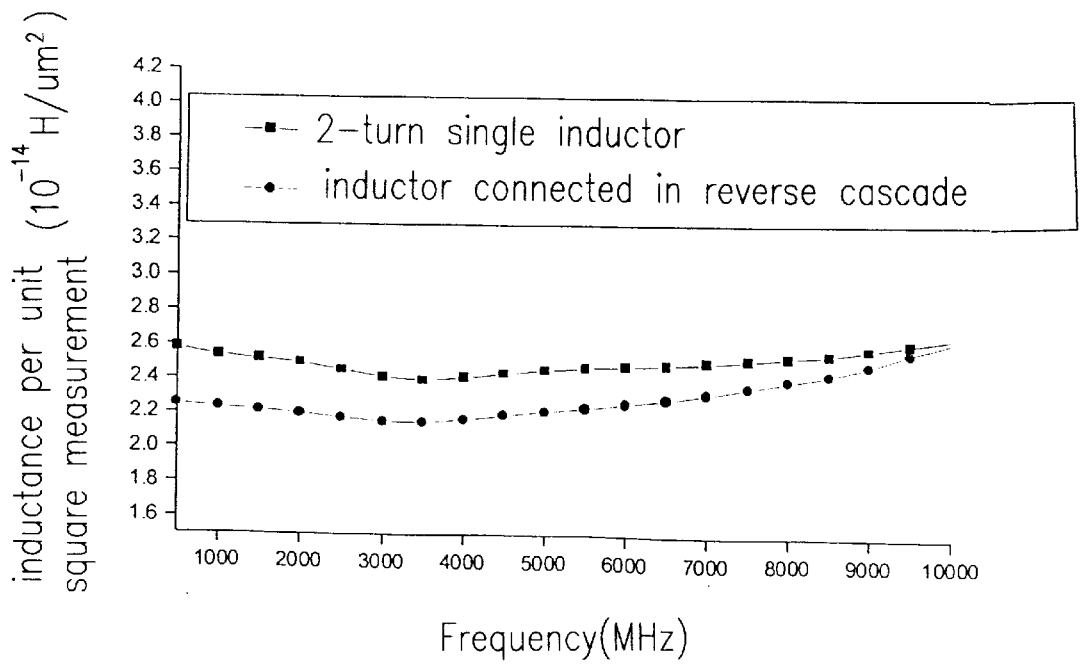
FIG. 11 shows a comparison of the inductance per unit square measurement between a single inductor and a combinational inductor in reverse cascade.

Refer to FIG. 11, which shows a comparison of the inductance per unit square measurement between a single inductor and a combinational inductor in reverse cascade. As shown in this figure, the inductance per unit square measurement for a combinational inductor using spiral conductors connected in reverse cascade is lower compared with the single inductor. The difference, however, is not significant. Also, the difference between these two implementations becomes marginal when the operating frequency increases. Typically, the inductance per unit square measurement for an inductor using spiral conductors connected in reverse cascade is 86% to 100% of that of a single inductor. This result achieved is significant. It is apparent that the presented structure provides a novel way to significantly reduce the space taken by an inductor, so as to minimize the size required in radio frequency (RF) circuits, and enhance the practicality in industry.

Note that the present invention provides a combinational inductor, which is implemented by using several spiral conductors connected in series, to increase the inductance per unit square measurement. The inductance per unit square measurement is not reduced while increasing the inductance values. On the contrary, the conventional way to increase the inductance value is by way of increasing number of turns of the inductor. Therefore, the inductance per unit square measurement is reduced when the inductance value is increased. For an inductor having more turns, the situation will be even worse. The combinational inductor structure presented in this invention is therefore capable of obtaining a larger inductance value for the same space available. Furthermore, the inductance per unit square measurement is not reduced when the inductance value is increased, so that the space can be utilized in a more efficient way. The use of several spiral conductors connected in series to implement a combinational inductor is one of the most significant characteristics of the present invention.

As a summary, the present invention has at least the following advantages when compared with the convention inductors:

1. The combinational inductor provided in the invention can be implemented using a single-layer structure, so as to reduce the complexities in the fabricating process to increase the reliability.

2. The combinational inductor provided in the invention is capable of significantly increasing inductance value while maintaining the original inductance per unit square measurement.

In addition, the combinational inductor provided in the invention is implemented using spiral conductors connected in series. It is therefore the spirit of the invention that the inductor can be constructed on the same layer. It is to be emphasized that the number of the spiral conductors in the preferred embodiments is for reference only, and is not used to limit the invention. Also, the term "inductor matrix" is defined as a collection of several inductors connected in series. Different number of inductors made by those who skilled in the art to the structure of the present invention without departing from the scope or spirit of the invention should fall within the scope of the following claims and their equivalents.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A combinational inductor, constructed on a surface of an isolator in a single layer, comprising a plurality of coplanar spiral conductors connected in series, wherein a pair of the spiral conductors is connected in reverse cascade and the plurality of coplanar spiral conductors having magnetic lines that flux internally.

2. The combinational inductor of claim 1, wherein said spiral conductors form a inductor matrix.

3. The combinational inductor of claim 1, wherein said isolator is a semiconductor substrate.

4. The combinational inductor of claim 1 wherein at least two of said plurality of spiral conductors have different inductance values.

5. The combinational inductor of claim 1, wherein the single layer is one of a silicon substrate and a germanium arsenic (GaAs) substrate.

6. A combinational inductor, comprising:
   an isolator; and
   a plurality of coplanar spiral conductors, wherein said spiral conductors are situated on the same layer of said isolator; wherein one of the spiral conductors is connected in reverse cascade with one neighboring spiral conductor.

7. The combinational inductor of claim 6, wherein said spiral conductors form a inductor matrix.

8. The combinational inductor of claim 6, wherein at least two of said plurality of spiral conductors have different inductance values.

9. The combinational inductor of claim 6, wherein said isolator is a semiconductor substrate.

* * * * *